(12) United States Patent
Yu

(10) Patent No.: US 6,429,484 B1
(45) Date of Patent: Aug. 6, 2002

(54) MULTIPLE ACTIVE LAYER STRUCTURE AND A METHOD OF MAKING SUCH A STRUCTURE

(75) Inventor: Bin Yu, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/633,208

(22) Filed: Aug. 7, 2000

(51) Int. Cl.[7] .................. H01L 27/01; H01L 27/12; H01L 31/0392
(52) U.S. Cl. .................................. 257/347; 257/67
(58) Field of Search ..................... 257/67, 347, 353, 257/354

(56) References Cited

U.S. PATENT DOCUMENTS

| | | | |
|---|---|---|---|
| 4,272,880 A | * | 6/1981 | Pashley |
| 4,381,201 A | * | 4/1983 | Sakurai |
| 4,996,574 A | | 2/1991 | Shirasaki |
| 5,041,884 A | * | 8/1991 | Kumamoto et al. |
| 5,128,732 A | * | 7/1992 | Sugahara et al. |
| 5,321,286 A | | 6/1994 | Koyama et al. |
| 5,346,834 A | | 9/1994 | Hisamoto et al. |
| 5,414,288 A | * | 5/1995 | Fitch et al. .................. 257/328 |
| 5,420,048 A | | 5/1995 | Kondo |
| 5,451,798 A | | 9/1995 | Tsuda et al. |
| 5,482,877 A | | 1/1996 | Rhee |
| 5,497,019 A | | 3/1996 | Mayer et al. |
| 5,554,870 A | * | 9/1996 | Fitch et al. .................. 257/334 |
| 5,581,101 A | | 12/1996 | Ning et al. |
| 5,591,653 A | | 1/1997 | Sameshima et al. |
| 5,612,552 A | | 3/1997 | Owens |
| 5,675,185 A | | 10/1997 | Chen et al. |
| 5,689,136 A | | 11/1997 | Usami et al. |
| 5,910,015 A | | 6/1999 | Sameshima et al. |
| 5,936,280 A | * | 8/1999 | Liu .............................. 257/347 |
| 5,981,345 A | | 11/1999 | Ryum et al. |
| 6,031,269 A | * | 2/2000 | Liu .............................. 257/347 |
| 6,172,381 B1 | * | 1/2001 | Gardner et al. ................ 257/67 |

FOREIGN PATENT DOCUMENTS

| | | |
|---|---|---|
| JP | 61-180466 | 8/1986 |
| JP | 3-288471 | 12/1991 |
| JP | 5-335482 | * 12/1993 |

OTHER PUBLICATIONS

"Smart–Cut: The Basic Fabrication Process for Unibond Soi Wafers" Herv, et al., Mar. 3, 1997.
"Sub–100nm Gate Length Metal Gate NMOS Transistors Fabricated by a Replacement Gate Process" By Chatterjee, Dec. 7–10, 1997 IEEE.

* cited by examiner

Primary Examiner—Ngân V. Ngô
(74) Attorney, Agent, or Firm—Foley & Lardner

(57) ABSTRACT

An integrated circuit includes multiple active layers. Preferably, a semiconductor-on-insulator (SOI) or silicon-on-insulator wafer is utilized to house a first active layer. A second active layer is provided above an insulative layer above the SOI substrate. Solid phase epitaxy can be used to form the second active layer. Subsequent active layers can be added by a similar technique. A seeding window can also be utilized.

20 Claims, 3 Drawing Sheets

MULTIPLE ACTIVE LAYER STRUCTURE AND A METHOD OF MAKING SUCH A STRUCTURE

CROSS-REFERENCE TO RELATED APPLICATIONS

The present application is related to U.S. application Ser. No. 09/483,678, filed Jan. 14, 2000, by Yu, entitled "Multiple Active Layer Integrated Circuit And A Method Of Making Such A Circuit"; U.S. application Ser. No. 09/633,312, filed on an even date herewith, by Yu, entitled "Double Gate Transistor Formed In A Thermal Process"; and U.S. application Ser. No. 09/599,141, filed Jun. 22, 2000, by Yu, entitled "A Process For Manufacturing Transistors Having Silicon/Germanium Channel Regions,". All are assigned to the assignee of the present application.

FIELD OF THE INVENTION

The present invention relates to integrated circuit devices. More particularly, the present invention relates to a multiple active layer integrated circuit structure and a method of manufacturing such a structure. Even more specifically, the present invention relates to a semiconductor-on-insulator (SOI) multiple active layer integrated circuit and method of making such an integrated circuit.

BACKGROUND OF THE INVENTION

Semiconductor devices, such as, processors, non-volatile memory, and other circuits include semiconductor elements, such as, metal oxide semiconductor field effect transistors (MOSFETS), diodes, resistors, and capacitors. For example, flash memory devices employ millions of floating gate FETs and processors employ millions of complementary MOSFETS. MOSFETS are generally disposed in active regions disposed in a base layer or substrate. Active regions typically include heavily doped silicon or other semiconductor materials. The regions can be doped with impurities, such as, phosphorous (P), boron (B), arsenic (As), or other material.

Semiconductor elements, such as, floating gate transistors and FETS, are generally bulk semiconductor-type devices in contrast to semiconductor-on-insulator-type devices, such as, silicon-on-insulator (SOI) devices. The floating gate transistors and FETs are disposed in a single plane (single active layer) on a top surface of a semiconductor substrate, such as, a single crystal silicon substrate.

In bulk semiconductor-type devices which have lateral FETs, the top surface of the substrate is doped to form source and drain regions, and a conductive layer is provided on the top surface of the semiconductor substrate between the source and drain regions to operate as a gate. In floating gate FETS, the gate is provided over a floating gate. The number of layers of lateral FETs is limited to one layer (e.g., the top surface) because only one active region is available in conventional planar processes. Additionally, the anisotropic nature of the top surface of the silicon substrate due to the conductive layer limits the number of metal layers and insulative layers which can be provided over the lateral FETs. Thus, in bulk semiconductor-type devices, circuit density is limited by the integration density of electrical components on the surface of the wafer (substrate).

The use of only a single active layer can waste valuable silicon material. Bulk-type semiconductor devices utilizing multiple layers have been proposed to reduce the cost of integrated circuits and more efficiently utilize substrate area. These proposed devices utilize seeded epitaxial layers or recrystallized amorphous silicon layers to form multiple layers. For example, multiple active layer devices have been built using epitaxially-seeded lateral overgrowth (ESLO) techniques.

Bulk semiconductor-type devices can be subject to some disadvantageous properties, such as, less than ideal subthreshold voltage slope during operation, high junction capacitance, and ineffective isolation. Additionally, bulk semiconductor-type devices often require epilayers, P-wells, or N-wells which require additional fabrication steps.

Semiconductor-on-insulator (SOI) (e.g., silicon-on-insulator) devices have significant advantages over bulk semiconductor-type devices, including near ideal subthreshold voltage slope, elimination of latch-up, low junction capacitance, and effective isolation between devices. SOI-type devices generally completely surround a silicon or other semiconductor substrate with an insulator and are a promising integration technology for sub-100 nm CMOS devices.

Devices, such as, conventional FETs or other transistors, are disposed on the silicon by doping source and drain regions and by providing gate conductors between the source and drain regions. The silicon is typically a very thin film (a silicon layer) separated from a bulk substrate or a support substrate by a thick buried oxide layer (a silicon dioxide layer). SOI devices provide significant advantages, including reduced chip size or increased chip density because minimal device separation is needed due to the surrounding insulating layers. Additionally, SOI devices can operate at increased speeds due to reduction in parasitic capacitance. These advantages are particularly important as integration technologies reach sub-100 nanometer levels for CMOS devices.

Conventional SOI devices generally have a floating substrate (the substrate is often totally isolated by insulating layers). Accordingly, SOI devices are subject to floating substrate effects, including current and voltage kinks, thermal degradation and large threshold voltage variations. SOI devices also can have some limited packing densities because they are limited in vertical integration. Generally, SOI devices can include a very thin (200–800 Å thick) silicon (Si) film separated from a bulk substrate by a thick buried silicon dioxide ($SiO_2$) layer (2000–3000 Å thick). However, the thin silicon film is generally the only active layer.

SOI devices utilizing multiple layers have also been proposed. Multiple layers in these devices are achieved by stacking SOI wafers on top of each other. SOI wafers are often relatively thick and expensive (often 4 to 5 times as expensive as a bulk-type wafer). U.S. Pat. Nos. 5,889,302 and 5,936,280, issued to the assignee of the present application on Mar. 30, 1999 and Aug. 10, 1999, respectively, discuss a quadruple-gate field effect transistor on an SOI substrate. Quadruple-gate MOSFETS on multiple SOI wafers are utilized to increase vertical integration. Interlayer vias cross wafer boundaries to make connections between wafers.

Thus, there is a need for an SOI semiconductor device which has improved density and improved vertical integration. Further, there is a need for an SOI device which includes more than one active layer. Further still, there is a need for method of manufacturing an SOI device including more than one active layer. Yet further, there is a need for a multi-layer device which has some of the advantages of SOI devices without utilizing multiple SOI wafers.

SUMMARY OF THE INVENTION

An exemplary embodiment relates to an integrated circuit. The integrated circuit includes a first semiconductor-oninsulator layer, a second active layer, and a second insulating layer. The semiconductor-on-insulator layer includes a first active layer and a first insulating layer. The first active layer contains a channel region and is disposed above the first insulating layer. The second active layer contains a second channel region. The second insulating layer is disposed between the second active layer and the first active layer. The second insulating layer includes a seeding window.

Another exemplary embodiment relates to a multilayer structure for containing a plurality of transistors. The multilayer structure includes a first layer and a second active layer. The first layer includes an oxide layer, a first active semiconductor layer, and a first insulating layer. The oxide layer is disposed below the first active layer. The first active layer is disposed below the first insulating layer. The second active layer is disposed above the first insulating layer. The second active layer is recrystallized through a seeding window in the first insulating layer. At least one transistor is at least partially disposed in the first active layer and at least another transistor is at least partially disposed in the second active layer.

Yet another exemplary embodiment relates to a method of fabricating a multilayer structure for containing transistors. The method includes providing a first semiconductor-on-insulator substrate, providing a first insulating layer over the semiconductor-on-insulator substrate, and providing a seeding window in the first insulating layer. The method also includes forming a single crystalline semiconductor layer above the first insulating layer.

BRIEF DESCRIPTION OF THE DRAWINGS

Preferred embodiments will hereinafter be described in conjunction with the appended drawings, wherein like numerals denote like elements.

DETAILED DESCRIPTION OF THE PREFERRED EMBODIMENTS

Figure 1:
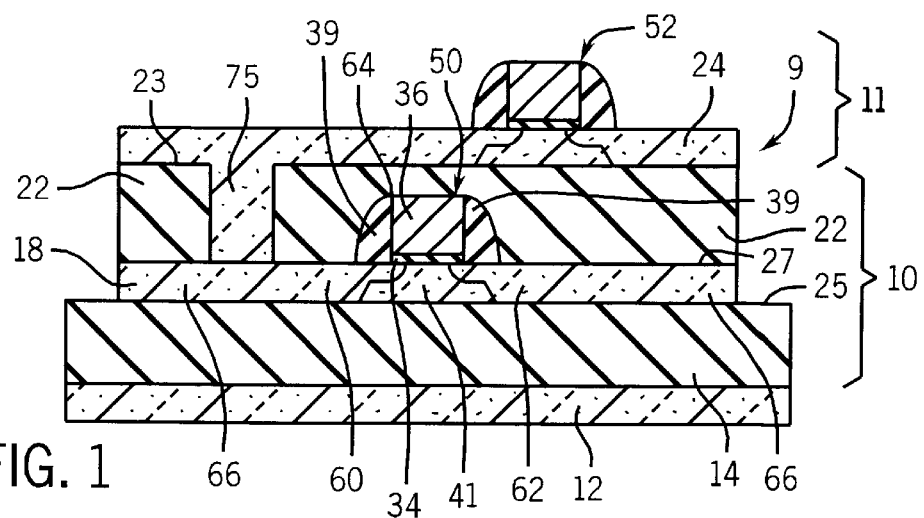
FIG. 1 is a cross-sectional view of an integrated circuit on a semiconductor-on-insulator (SOI) substrate, the integrated circuit including two active layers in accordance with an exemplary embodiment.

With reference to FIG. 1, a multilayer integrated circuit 9 includes a first integrated circuit 10 and a second integrated circuit 11. Circuit 10 is preferably a first semiconductor-on-insulator (SOI) layer, and circuit 11 is preferably a second layer. First integrated circuit 10 is stacked below second integrated circuit 11. Circuit 11 can be built on a recrystallized film as described below with reference to FIGS. 1–7.

Circuit 10 includes an insulating layer 14, an active layer or a semiconductor substrate 18, and an insulating layer 22. Circuit 10 can also include a support substrate 12. Circuit 10 is a SOI-based layer, substrate or platform.

Support substrate 12 is preferably a semiconductor material. Support substrate 12 can also be an insulating material or other base layer for integrated circuit 10. Support substrate 12 can be silicon dioxide, silicon, polyester, or a flexible material. Insulating layer 14 is preferably a buried oxide layer, such as a silicon dioxide layer, disposed between substrate 18 and substrate 12.

Active layer or semiconductor substrate 18 is preferably a very thin silicon film separated from support substrate 12 by insulating layer 14. Preferably, semiconductor substrate 18 is 200–800 angstroms (Å) thick and insulating layer 14 is 2,000–3,000 Å thick. In one embodiment, substrate 18 can be 200–500 Å thick.

Insulating layers 14 and 22 can be any dielectric or insulating material. Preferably, layer 22 is a deposited high-temperature oxide, such as, chemical vapor deposited (CVD) tetraethylorthosilicate (TEOS) oxide, silicon dioxide, spin-on-glass (SOG), plasma enhanced CVD (PECVD) TEOS oxide, SiH-based oxide, PECVD oxide, or a two-layer glass and nitride material. Layer 14 can be formed similar to layer 22. Alternatively, layer 14 can be formed via an oxygen ion implantation process.

Semiconductor substrate 18 preferably includes active regions, such as, doped regions utilized in the formation of transistors, such as, transistor 50. Active layer or substrate 18 can include an N-type or P-type well. Active layer or substrate 18 is preferably a single crystalline silicon substrate or other suitable material for transistor 50. Doped regions in substrate 18 can include a source region 60 and a drain region 62.

Transistor 50 can include a gate structure 64 disposed between regions 60 and 62. Gate structure 64 can include spacer 39, a gate dielectric layer 34, and a polysilicon conductor 36. Gate structure 64, source 60 and drain 62 can be silicided in accordance with conventional fabrication techniques.

Gate stack or structure 64 includes a gate dielectric layer 34 and a gate conductor 36. Dielectric layer 34 is preferably comprised of a thermally grown, 15–25 Å thick, silicon dioxide material. Alternatively, deposited silicon nitride ($Si_3N_4$) material or high-K gate dielectric materials can be utilized.

Gate structure 64 can also include a pair of sidewall spacers 39. Spacers 39 can be manufactured in a conventional silicon dioxide deposition and etch-back process. Alternatively, other insulative material such as nitride can be utilized to form spacers 39.

Conductor 36 is preferably deposited as polysilicon by chemical vapor deposition (CVD) and etched to form the particular structure for transistor 12. Conductor 36 is preferably doped polysilicon. Alternatively, conductor 36 can include metal, such as a refractory metal, or germanium to adjust the work function of transistor 50. Gate structure 64 has a height or thickness of 800–1200 Å.

Regions 60 and 62 extend from a top surface 27 of layer 18 to a top surface 25 of layer 14. Regions 60 and 62 are preferably 300–800 Å from top surface 27 to top surface 25 of layer 14 (junction depth) and can include a source extension and a drain extension below top surface 27. The extensions are preferably ultra-shallow.

For an N-channel transistor, regions 60 and 62 are heavily doped with N-type dopants (e.g., $5 \times 10^{19}$–$1 \times 10^{20}$ dopants per cubic centimeter). For a P-channel transistor, regions 60 and 62 are heavily doped with P-type dopants (e.g., $5 \times 10^{19}$–$1 \times 10^{20}$ dopants per cubic centimeter). Appropriate dopants for a P-channel transistor include boron, boron diflouride, or iridium, and appropriate dopants for an N-channel transistor include arsenic, phosphorous, or antimony.

Transistor 50 can be a P-channel or N-channel metal oxide semiconductor field effect transistor (MOSFET), a floating gate transistor, or other electronic device. Transistor 50 is preferably embodied as a fully depleted (FD) SOI MOSFET.

A channel region 41 is disposed below gate structure 64. Channel region 41 can be doped according to conventional processes. Also, region 41 can be fabricated to have increased charge carrier mobility. Channel region 41 has a width slightly less than the gate length of gate structure 64 (e.g., 35 nm–100 nm). Region 41 can advantageously include a semiconductor containing germanium for increased charge carrier mobility. The width of region 41 is downwardly diverging, having a narrower width at a junction with gate structure 64 than the width near surface 25 of layer 14.

Semiconductor substrate 18 can include isolation regions which separate active regions for multiple adjacent transistors on substrate 18. Isolation regions 66 can be insulating regions, such as, silicon dioxide regions formed in conventional local oxidation of silicon (LOCOS) processes. Alternatively, the isolation regions can be formed in a shallow trench isolation (STI) process. Circuit 10 can include any number and type of semiconductor elements in and above layer 18.

Integrated circuit 11 is shown including an active layer or semiconductor substrate 24. Semiconductor substrate 24 is similar to semiconductor substrate 18 and houses a transistor 52. Substrate 18 is preferably a single crystalline semiconductor material (most preferably silicon). Therefore, circuit 9 includes multiple active layers which house semiconductor elements, such as, transistors 50 and 52, on two separate active layers, such as, substrates 18 and 24.

Transistor 52 is similar to transistor 50. Transistors 50 and 52 can be any type of semiconductor elements including CMOS FETS, FETS, diodes, floating gate transistors, resistors, or other devices which utilize active regions. Substrate 24 can also include isolation regions. Substrate 24 is preferably doped to form active regions associated with transistor 52. Circuit 11 may include an insulating layer similar to insulating layer 22 above substrate 24. In addition, metal layers or conductive layers can be provided over the insulating layer above layer 24. The metal layers can include vias for connecting circuitry between circuits 10 and 11. The vias can extend from multiple metal layers to substrates 18 and 24.

Substrates 24 and 18 are coupled together or physically attached through a seeding window 75. Preferably, seeding window 75 is filled with the material associated with substrate 24. Window 75 can be a via or aperture approximately 0.3–1.5 micrometer wide. Window 75 can have a horizontal cross-section in a variety of shapes including circles, squares, rectangles, etc. As shown in FIG. 1, window 75 connects source region 60 of transistor 50 with a source region of transistor 52.

Layer 22 is preferably approximately 2000–3000 Å thick and has a smooth planar surface 23. Window 75 can be utilized as a short circuit between substrates 24 and 18 or for contacts to various conductors including gate conductors, back gate conductors, or other structures depending upon layout and design for circuit 9. Window 75 can also be covered within a trench isolation process. Window 75 is utilized by proper seeding for substrate 18 as discussed below with reference to FIGS. 6–7. Advantageously, circuit 9 can utilize vias that only travel through a single insulating layer 22 to connect substrates 24 and 18. Unlike conventional processes, entire wafers do not need to be traversed because substrate 18 is formed directly on top of layer 22.

Figure 2:
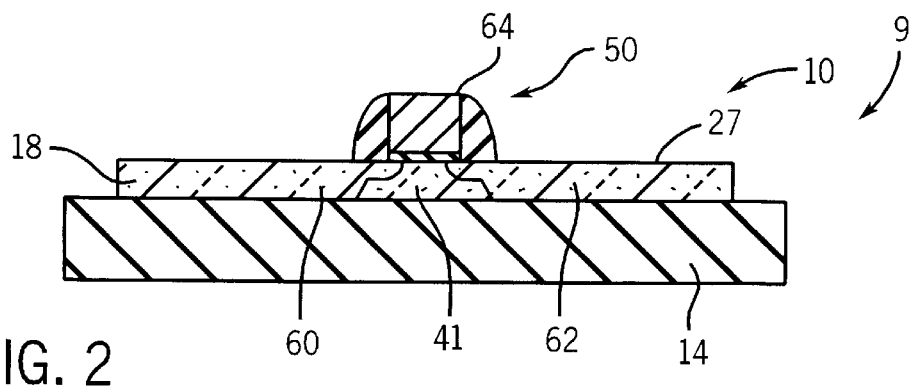
FIG. 2 is a cross-sectional view of the SOI substrate including one of the active layers illustrated in FIG. 1, the SOI substrate is utilized to manufacture the integrated circuit illustrated in FIG. 1.

With reference to FIGS. 1–7, the manufacture of integrated circuit 9 is discussed below. In FIG. 2, integrated circuit 10 is disposed on an SOI substrate and includes active layer or substrate 18 and transistor 50. Transistor 50 can be fabricated on substrate 18 in accordance with any number of conventional transistor fabrication techniques.

Layer 14 and substrate 18 can be all or part of a silicon-on-insulator (SOI) wafer. Such a wafer can be purchased from a variety of sources, or can be manufactured by implanting oxygen into a bulk semiconductor substrate. In addition, the SOI wafer can be formed by placing an epitaxial silicon layer on top of an insulating layer 22.

Transistor 50 is built at least partially within substrate 18 (e.g., includes source 60 and drain 62 below top surface 27 of substrate 18). Transistor 50 can be fabricated in a variety of processes. For example, conventional deposition, etching and fabrication processes can be utilized to form transistor 50.

Figure 3:
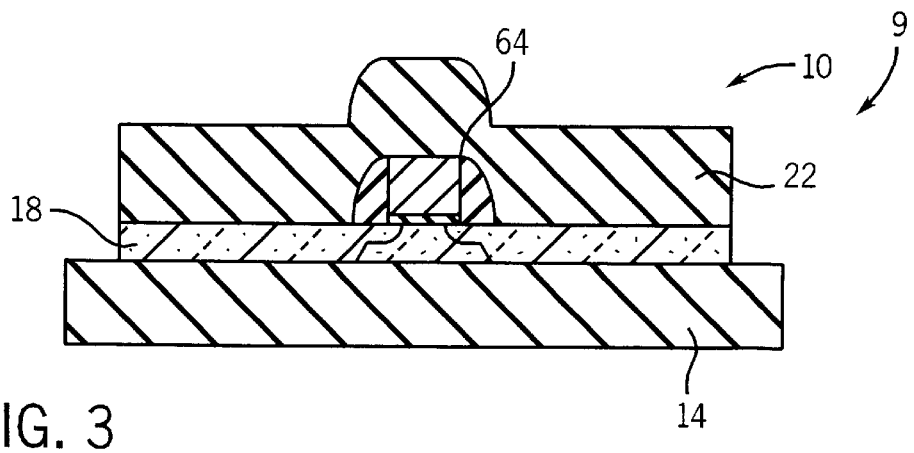
FIG. 3 is a cross-sectional view of the SOI substrate illustrated in FIG. 2, showing an insulating layer deposition step.

In FIG. 3, insulating layer 22 is deposited above transistor 50 and substrate 18. Layer 22 is preferably deposited after transistor 50 is completed. Layer 22 is deposited on top of transistor 50 and over substrate 18. Layer 22 can be a 4,000–5,000 Å thick silicon dioxide layer deposited in a TEOS-based chemical vapor deposition (CVD) process.

Figure 4:
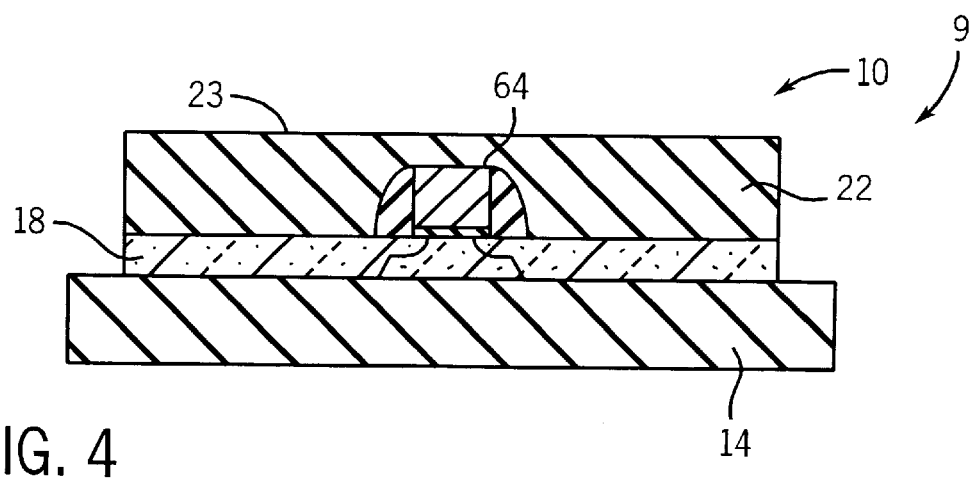
FIG. 4 is a cross-sectional view of the SOI substrate illustrated in FIG. 3, showing a chemical mechanical polishing (CMP) step.

In FIG. 4, insulating layer 22 is polished to remove approximately 2,000 Å of material. Preferably, layer 22 can be polished in a chemical-mechanical polish (CMP) process to leave approximately 2,000–3,000 Å of material having a planar top surface 23. After polishing, layer 22 can be subjected to a chemical etch to remove an additional 50A of material. The chemical etch enhances the smoothness of surface 23.

Figure 5:
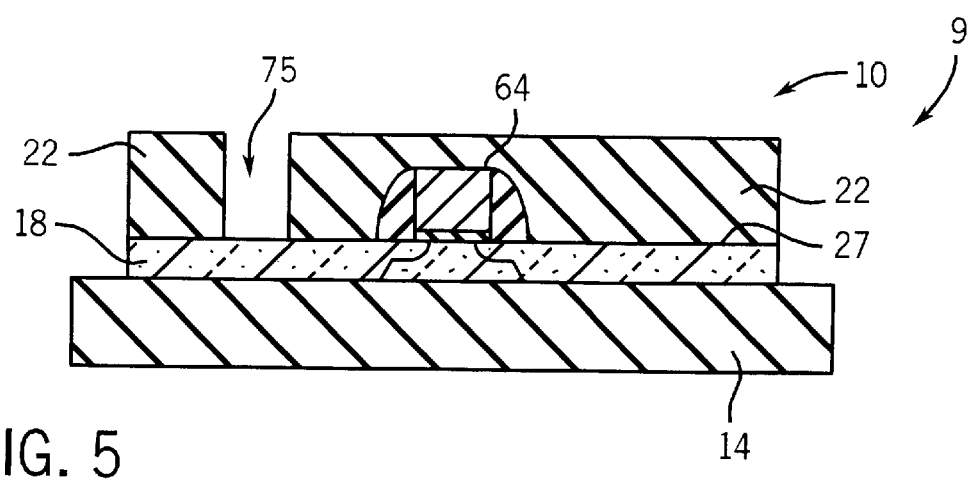
FIG. 5 is a cross-sectional view of the SOI substrate illustrated in FIG. 4, showing a lithographic step which forms a seeding window.

In FIG. 5, a photolithographic process is utilized to form a seeding window 75 in layer 22. Preferably, layer 22 is etched in accordance with a photolithographic mask to form seeding window 75. Preferably, the etching process is a dry etch process selective to silicon dioxide. Window 75 is etched until top surface 27 of substrate 18 is reached.

Figure 6:
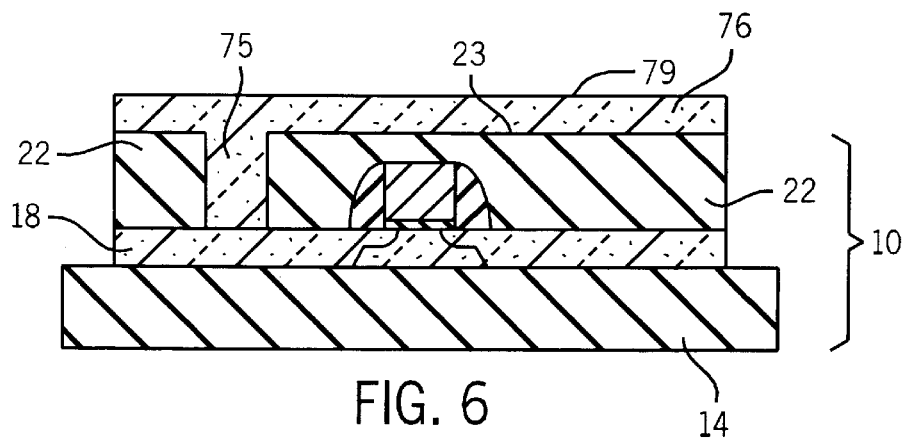
FIG. 6 is a cross-sectional view of the SOI substrate illustrated in FIG. 5, showing an amorphous semiconductor deposition step.

In FIG. 6, a conformal layer 76 is deposited in window 75 and above surface 23 of layer 22. Layer 76 is preferably associated with substrate 24 (FIG. 1). Layer 76 can be an amorphous semiconductor layer, such as, an amorphous silicon layer. Layer 76 is preferably deposited as a thin layer (200–500Å thick) by CVD or PECVD. The thickness of layer 76 is measured from surface 23 of layer 22 to surface 79 of layer 76.

Figure 7:
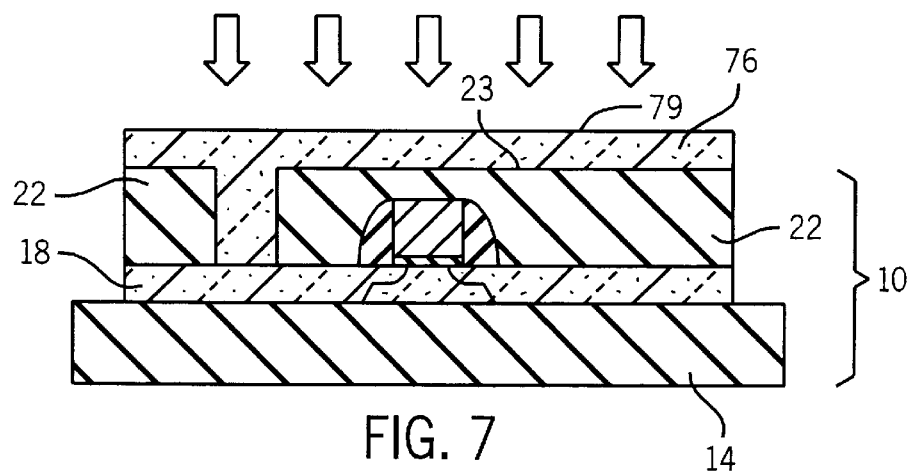
FIG. 7 is a cross-sectional view of the SOI substrate illustrated in FIG. 6, showing a thermal process step.

In FIG. 7, after layer 76 is deposited, layer 76 and integrated circuit 10 are subject to a thermal process, such as, an annealing process. Preferably, a very low temperature furnace annealing process is utilized to melt layer 76 (e.g., at 450–550° C.). Alternatively, other annealing processes can be utilized. For example, an excimer laser beam having a 308 nm wavelength can heat layer 76. Preferably, the laser energy melts layer 76 to form a single crystalline substrate 18. Alternatively, other furnace annealing and rapid thermal annealing (RTA) processes can be utilized.

In FIG. 1, after the annealing is complete, layer 76 becomes recrystallized. In one embodiment, a solid phase epitaxy technique is utilized to form or crystallize substrate 24. Solid phase epitaxy refers to a crystallization process by which an amorphous semiconductor film (silicon, silicon/germanium, or germanium) is converted into crystalline semiconductor (silicon, silicon/germanium, or germanium) of a single orientation matching the orientation of an existing crystal structure (silicon, silicon/germanium, or germanium) start layer. Solid phase epitaxy is usually achieved by heating the amorphous semiconductor layer. Alternatively, a low temperature (e.g., 550–600° C.) rapid thermal anneal can be utilized.

Seeding window 75 allows substrate 18 to be utilized as a start or seeding layer for substrate 24. Preferably, substrate 24 is recrystallized as single crystalline material. After substrate 24 is recrystallized, transistor 52 is formed according to a process similar for forming transistor 50.

After transistor 52 is formed, conventional semiconductor processes are utilized to complete integrated circuit 11. Various CMOS processes can be utilized to interconnect transistors 50 and 52. After transistor 52 is formed, further deposition steps and etching and photolithography steps can be utilized to form other conductive, semiconductive, and insulative structures. The conventional processes can include major pad contact formation and interconnect formation for connections between substrates 18 and 24.

Figure 8:
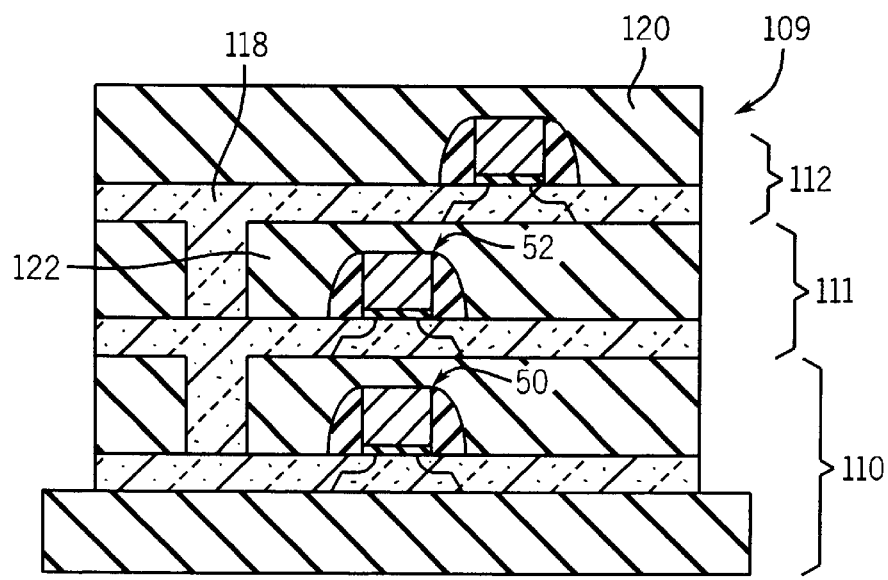
FIG. 8 is a cross-sectional view of an integrated circuit on an SOI substrate, the integrated circuit including three active layers in accordance with another exemplary embodiment.

With reference to FIG. 8, an integrated circuit 109 according to another exemplary embodiment includes integrated circuits 110, 111 and 112. Integrated circuit 110 is similar to integrated circuit 10 discussed with reference to FIG. 1. Integrated circuit 111 is similar to integrated circuit 11 discussed with reference to FIG. 1. Integrated circuit 112 is also similar to integrated circuit 111 and is provided above integrated circuit 111 according to the same process steps discussed with reference to FIGS. 1–7. For example, an insulating layer 122 is deposited over transistor 52. A technique similar to the technique utilized to form substrate 18 forms substrate 118. Substrate 118 is similar to substrate 18 (FIG. 1). Therefore, FIG. 8 shows an integrated circuit 109 including three active layers.

A further insulating layer 120 can be provided above integrated circuit 112. Metal layers or yet another active layer can be provided above layer 120.

In one aspect of the embodiment, transistor 50 has near ideal subthreshold voltage slope, low junction capacitance, an effective isolation, and increased current density. Transistor 50 can have a non-floating (e.g., a biased) substrate to reduce floating substrate effects, such as, current and voltage kinks, thermal degradation, and large voltage variations.

Principles, structures and examples discussed in the related patent application filed on an even date herewith by Yu entitled "Double Gate Transistor Having A Silicon/Germanium Channel Region" are incorporated herein by reference and can be utilized in the embodiments of the present application.

It is understood that, while the detailed drawings and specific examples describe the exemplary embodiments of the present invention, they are there for the purpose of illustration only. The apparatus and method of the invention is not limited to the precise details, geometries, dimensions, materials, and conditions disclosed. For example, although particular layers are described as being particular sizes, other sizes can be utilized. Further still, although polysilicon is used as a gate conductor, other conductor materials can be utilized. Even further still, the drawings are not drawn to scale. Various changes can be made to the precise details discussed without departing from the spirit of the invention which is defined by the following claims.

What is claimed is:

1. An integrated circuit, comprising:
    a semiconductor-on-insulator layer including a first active layer and a first insulating layer, the first active layer containing a first channel region between a pair of first source/drain regions and being disposed above the first insulating layer;
    a second active layer containing a second channel region between a pair of second source/drain regions; and
    a second insulating layer being disposed between the second active layer and the first active layer, the second insulating layer including a seeding window, the seeding window being filled with material from the second active layer, thereby connecting one of the first sources drain regions to one of the second source/drain regions, wherein the one of the first source/drain regions is directly aligned with and below the one of the second source/drain regions.

2. The integrated circuit of claim 1, wherein the second active layer is formed via solid phase epitaxy.

3. The integrated circuit of claim 2, wherein the first active layer is physically connected to the second active layer through the seeding window.

4. The integrated circuit of claim 1, wherein the first active layer and the second active layer are each less than 500 Å thick.

5. The integrated circuit of claim 1 further comprising:
    a third insulating layer above the second active layer; and
    a third active layer above the third insulating layer.

6. The integrated circuit of claim 5, wherein the third active layer is physically connected to the second active layer through a second seeding window, the second seeding window being disposed through the third insulating layer.

7. The integrated circuit of claim 6, wherein the third active layer includes third source/drain regions and one of the third source/drain regions is coupled through the second seeding window to the one second source/drain region, the second seeding window being aligned with the first seeding window.

8. A multilayer structure for containing a plurality of transistors, the multilayer structure comprising:
    a first layer including an oxide layer, a first active semiconductor layer, and a first insulating layer, the oxide layer being disposed below the first active layer, the first active layer being disposed below the first insulating layer;
    a second active layer disposed above the first insulating layer, the second active layer being recrystallized through a first seeding window in the first insulating layer, the second active layer being disposed below a second insulating layer; and
    a third active layer disposed above the second insulating layer, the third active layer being recrystallized through a second seeding window is aligned with respect to the first seeding window, wherein at least one transistor is at least partially disposed in the first active layer and at least another transistor is disposed a least partially in the second active layer wherein at least a further transistor is being disposed, at least partially in the third active layer.

9. The multilayer structure of claim 8, wherein a conductive via is disposed through the first insulating layer, the conductive via being electrically coupled to the first active layer and the second active layer.

10. The multilayer structure of claim 8 further comprising a second insulating layer disposed above the second active layer.

11. The multilayer structure of claim 10, wherein the second active layer is formed from an amorphous silicon layer.

12. The multilayer structure of claim 8, wherein the first layer and the second active layer crystallographically communicate through the first seeding window.

13. The multilayer structure of claim 10, wherein the third active layer is crystallographically communicates through the second seeding window.

14. The multilayer structure of claim 8 further comprising a substrate disposed below the oxide layer.

15. A semiconductor-on-insulator integrated circuit including a first active layer and a first insulating layer, the first active layer containing a first channel region and being disposed above the first insulating layer, a second active layer containing a second channel region, and a second insulating layer being disposed between the second active layer and the first active layer, the second insulating layer including a first seeding window, wherein the integrated circuit further involves a third active layer containing a third channel region, the third active layer being above a thin insulative layer having a second seeding window, the second seeding window being above the first seeding window, is manufactured by:

provautomatically providing the semiconductor-on-insulator substrate;

providing the second insulating layer over the semiconductor-on-insulator substrate;

providing the first seeding window in the second insulating layer; and forming a single crystalline semiconductor layer above the first insulating layer for the second active layer.

16. The integrated circuit of claim 15, wherein the forming step includes depositing an amorphous silicon layer.

17. The integrated circuit of claim 16, wherein the amorphous silicon layer is heated to form the single crystalline semiconductor layer.

18. The integrated circuit of claim 17 further comprising depositing the third insulating layer over the single crystalline semiconductor layer.

19. The integrated circuit of claim 18 further comprising:

forming the second seeding window through the third insulating layer; and forming a second single crystalline semiconductor layer above the second insulating layer.

20. The integrated circuit of claim 15, wherein the forming step utilizes a laser anneal or very low temperature furnace anneal.

* * * * *